(12) United States Patent
Li et al.

(10) Patent No.: US 12,316,092 B2
(45) Date of Patent: May 27, 2025

(54) CIRCUIT SYSTEM AND MANUFACTURING AND OPERATING METHOD THEREFOR

(71) Applicant: INNOSCIENCE (ZHUHAI) TECHNOLOGY CO., LTD., Zhuhai (CN)

(72) Inventors: Yan-Cun Li, Zhuhai (CN); Yi Sun, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 184 days.

(21) Appl. No.: 17/989,611

(22) Filed: Nov. 17, 2022

(65) Prior Publication Data

US 2024/0170943 A1 May 23, 2024

(51) Int. Cl.
*H02H 3/10* (2006.01)
*H02H 1/00* (2006.01)
*H02H 5/04* (2006.01)

(52) U.S. Cl.
CPC ............ *H02H 3/10* (2013.01); *H02H 1/0007* (2013.01); *H02H 5/04* (2013.01)

(58) Field of Classification Search
CPC .......... H02H 1/00; H02H 3/10; H02H 1/0007; H02H 5/04; H03K 17/122; H03K 2217/0027; H03K 17/0822; H03K 17/567; H03K 17/14
See application file for complete search history.

(56) References Cited

U.S. PATENT DOCUMENTS

| | | | |
|---|---|---|---|
| 2014/0321012 A1* | 10/2014 | Nakayama | H02M 1/088 361/57 |
| 2020/0021284 A1* | 1/2020 | Thalheim | H02M 1/32 |
| 2022/0376490 A1* | 11/2022 | Sheng | H02H 7/20 |
| 2023/0208129 A1* | 6/2023 | Liu | H03K 17/0822 361/87 |
| 2024/0204058 A1* | 6/2024 | Zhao | H10D 84/01 |
| 2024/0304630 A1* | 9/2024 | Yamagiwa | H10D 30/87 |

\* cited by examiner

*Primary Examiner* — Jared Fureman
*Assistant Examiner* — Nicolas Bellido
(74) *Attorney, Agent, or Firm* — Li & Cai Intellectual Property (USA) Office

(57) ABSTRACT

A circuit system includes a power circuit and an operation circuit. The operation circuit is electrically connected to the power circuit. The operation circuit is configured to control operation of the power circuit, detect a first signal of the power circuit during the operation, and protect the power circuit in response to the first signal.

15 Claims, 14 Drawing Sheets

CIRCUIT SYSTEM AND MANUFACTURING AND OPERATING METHOD THEREFOR

BACKGROUND OF THE INVENTION

1. Field of the Invention

The disclosure relates to a circuit system and a manufacturing and operating method therefor, and in particular, to a circuit system applicable to high-power operation and a manufacturing and operating method therefor.

2. Description of the Related Art

An assembly including a direct band gap semiconductor such as those including III-V materials or III-V compounds (category: III-V compounds) can operate or function in various conditions or various environments (for example, at different voltages and frequencies).

The semiconductor assembly may include a heterojunction bipolar transistor (HBT), a heterojunction field effect transistor (HFET), a high is electron mobility transistor (HEMT), a modulation doped FET (MODFET), and the like.

SUMMARY OF THE INVENTION

According to some embodiments of the disclosure, a circuit system includes a power circuit and an operation circuit. The operation circuit is electrically connected to the power circuit. The operation circuit is configured to control operation of the power circuit, detect a first signal of the power circuit during the operation, and protect the power circuit in response to the first signal.

According to some embodiments of the disclosure, a method for manufacturing and operating a circuit system includes: forming a power circuit, the power circuit being applicable to a high-power operation; forming an operation circuit, the operation circuit being electrically connected to the power circuit, and including a switch transistor, and the operation circuit being configured to control the operation of the power circuit; detecting a first signal of the power circuit; and protecting the power circuit.

According to some embodiments of the disclosure, a circuit system includes a first power circuit and an operation circuit. The first power circuit includes a plurality of first switch transistors. The plurality of first switch transistors are connected in parallel. The operation circuit is electrically connected to the first power circuit. The operation circuit is configured to control the plurality of first switch transistors. An operating voltage of the operation circuit is less than an operating voltage of the plurality of first switch transistors.

According to the circuit system provided in the disclosure, one operation circuit can be used in combination with a plurality of power circuits in a modular manner, different product forms may be designed according to use requirements, and various detection circuits, driving circuits, logic control and protection circuits can be highly integrated. Compared with a comparative example in which one operation circuit and one power circuit are used and are connected in parallel, the circuit system in the disclosure operates, controls, and detects the plurality of high-voltage power circuits through a low-voltage operation circuit, and reduces the work errors by optimizing the chip processes or tightening the tests, which effectively avoids adverse effects caused by various effects such as parasitic parameters, delay differences, and electrical mismatches caused by adding both a high-voltage circuit assembly and a low-voltage circuit assembly.

BRIEF DESCRIPTION OF THE DRAWINGS

The aspects of the disclosure will become more comprehensible according to the following detailed description made with reference to the accompanying drawings. It is prudent to consider that various features may not be drawn to scale. Actually, the sizes of the various features may be increased or reduced arbitrarily for the purpose of clear description.

The accompanying drawings and specific implementation use the same reference numerals to indicate same or similar components. The disclosure will be more apparent from the detailed descriptions made with reference to the accompanying drawings.

PREFERRED EMBODIMENT OF THE PRESENT INVENTION

Figure 1A:
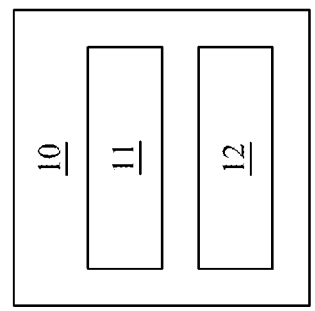
FIG. 1A is a block diagram of a circuit system according to some embodiments of the disclosure.

The following disclosure provides many different embodiments or examples of different features used to implement the provided subject. Specific examples of components and arrangements are described below. Certainly, there are merely examples and are not intended to be limitative. In the disclosure, reference to forming or setting the first feature on or above the second feature may include an embodiment in which the first feature and the second feature are formed or set as a direct contact, and may also include an embodiment in which additional features may be formed or set between the first feature and the second feature so that the first feature and the second feature may not be in direct contact. In addition, in the disclosure, reference numerals and/or letters may be repeated in various examples. Such repetitions are for simplification and clarity, and are not intended for limiting relationships between the embodiments and/or configuration discussed.

The embodiments of the disclosure are described in detail below. However, it should be understood that the disclosure provides many applicable concepts that can be embodied in a wide variety of specific contexts. The specific embodiments discussed are merely illustrative and do not limit the scope of the disclosure.

FIG. 1A is a block diagram of a circuit system 10 according to some embodiments of the disclosure. The circuit system 10 may include but is not limited to a power circuit 11 and an operation circuit 12. The operation circuit 12 may be electrically connected to the power circuit 11. In some embodiments, the operation circuit 12 may be configured to control operation of the power circuit 11. The circuit system 10 is applicable to operation at a high power, which may include, but is not limited to, more than 600 volts, more than 800 volts, more than 1000 volts, or more than 1500 volts. Application of the circuit system 10 may include but is not limited to automotive electronics, industrial electronics, and solar energy systems. In some embodiments, the operation circuit 12 may detect a signal of the power circuit 11 during the operation and protect the power circuit 11 in response to the signal. The above protection may include but is not limited to overvoltage protection, overcurrent protection, and overtemperature protection.

In some embodiments, one operation circuit 12 may be electrically connected to one power circuit 11. The operation circuit 12 may operate at a low voltage, and the power circuit 11 may operate at a high voltage. The operation circuit 12 and the power circuit 11 may be packaged separately. The operation circuit 12 and the power circuit 11 may be packaged as a whole. In some embodiments, one operation circuit 12 may be electrically connected to a plurality of power circuits 11. The operation circuit 12 and the plurality of power circuits 11 may be packaged separately. The operation circuit 12 and the plurality of power circuits 11 may be packaged as a whole. Compared with a comparative example in which one operation circuit and one power circuit are used and are connected in parallel, the circuit system in the disclosure operates, controls, and detects the plurality of high-voltage power circuits through a low-voltage operation circuit, which effectively avoids adverse effects caused by various effects such as parasitic parameters, delay differences, and electrical mismatches caused by parallel connection of a high-voltage circuit assembly and a low-voltage circuit assembly.

Figure 1B:
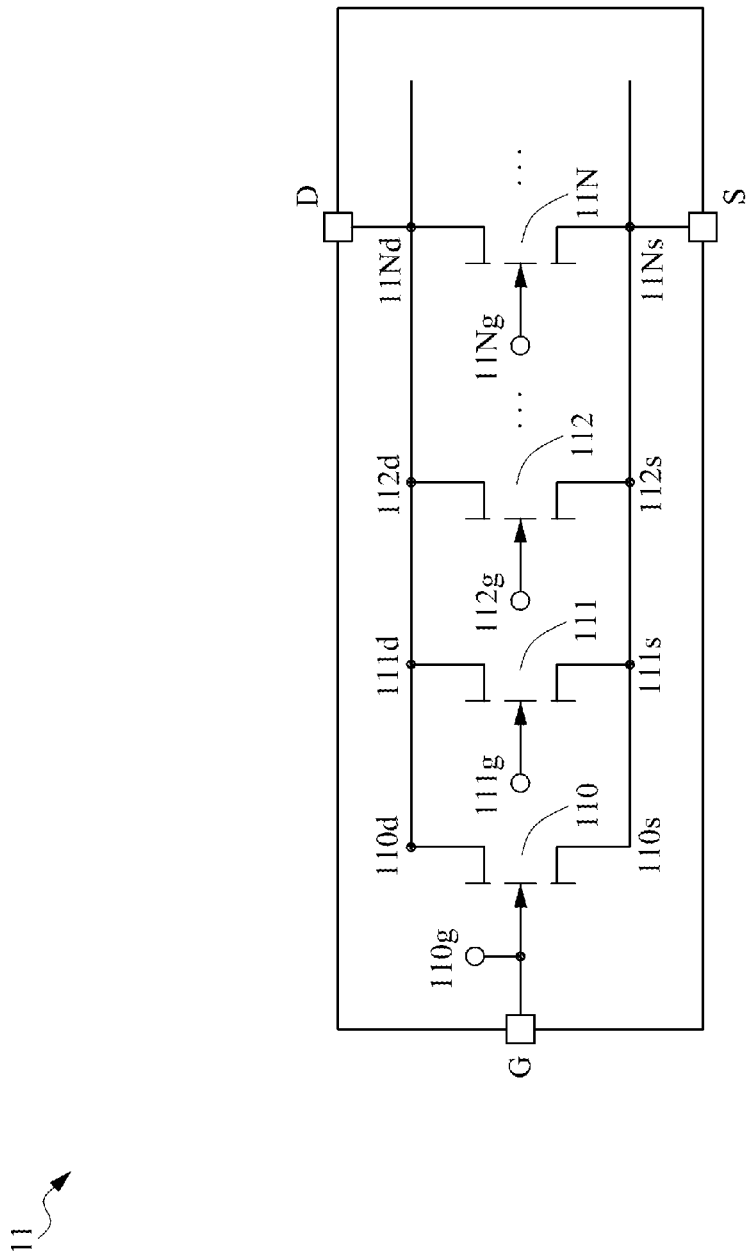
FIG. 1B is a topology diagram of a power circuit according to some embodiments of the disclosure.

FIG. 1B is a topology diagram of the power circuit 11 according to some embodiments of the disclosure. The power circuit 11 may include but is not limited to an endpoint G, an endpoint D, and an endpoint S. The power circuit 11 may include a plurality of switch transistors 110, 111, 112 to 11N. Each of the switch transistors 110, 111, 112 to 11N may include a transistor. The plurality of switch transistors 110, 111, 112 to 11N may include a GaN HEMT, a SiC JFET, a SiC MOSFET, or a Silicon MOSFET, which is not limited in the disclosure.

The plurality of switch transistors 110, 111, 112 to 11N may be electrically connected to each other. The plurality of switch transistors 110, 111, 112 to 11N may be connected in parallel. As shown in FIG. 1B, drains 110d, 111d, 112d to 11Nd of the plurality of switch transistors may be electrically connected to the endpoint D. The drains 110d, 111d, 112d to 11Nd of the plurality of switch transistors may be electrically connected to each other. In some embodiments, sources 110s, 111s, 112s to 11Ns of the plurality of switch transistors may be electrically connected to the endpoint S.

The sources 110s, 111s, 112s to 11Ns of the plurality of switch transistors may be electrically connected to each other. In some embodiments, gates 110g, 111g, 112g to 11Ng of the plurality of switch transistors may be electrically connected to the endpoint G. The gates 110g, 111g, 112g to 11Ng of the plurality of switch transistors may be electrically connected to each other.

Figure 1C:
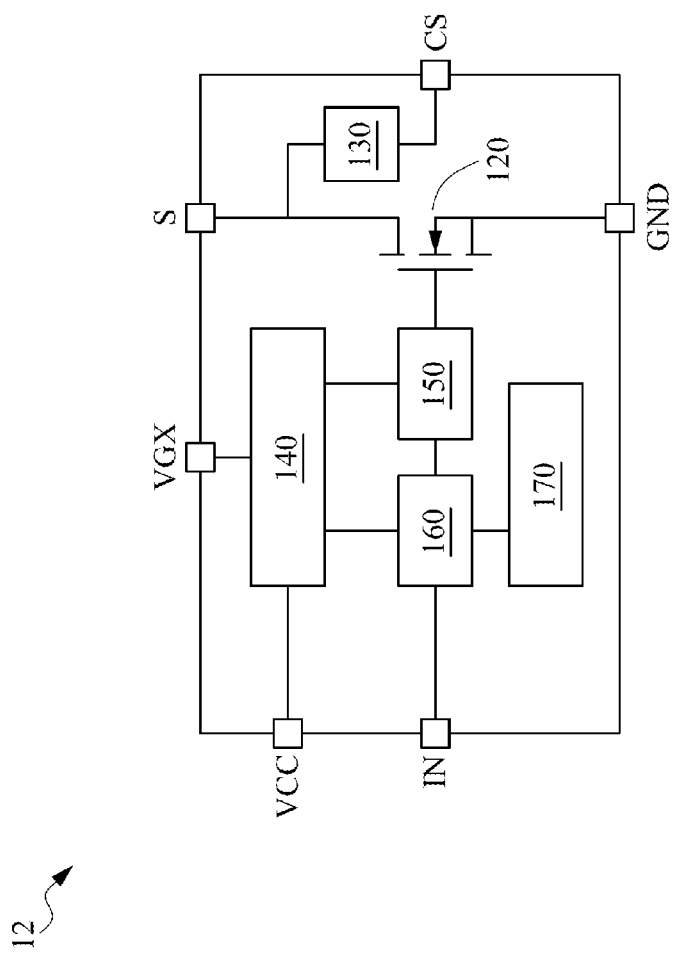
FIG. 1C is a topology diagram of an operation circuit according to some embodiments of the disclosure.

FIG. 1C is a topology diagram of an operation circuit 12 according to some embodiments of the disclosure.

As shown in FIG. 1C, the operation circuit 12 may include but is not limited to a switch transistor 120, a detection circuit 130, a power management circuit 140, a gate driver 150, a logic circuit 160, and a protection circuit 170. The operation circuit 12 may include but is not limited to an endpoint S, an endpoint VGX, an endpoint VCC, an endpoint IN, an endpoint GND, and an endpoint CS. The endpoint GND may be grounded. The endpoint S of the operation circuit 12 may be electrically connected to the endpoint S of the power circuit 11, as shown in FIG. 1B, to control, operate, or detect the switch transistors in the power circuit 11.

In some embodiments, the switch transistor 120 is electrically connected between the endpoint S and the endpoint GND. In some embodiments, the switch transistor 120 may include an NMOS transistor. In some embodiments, the switch transistor 120 may include a PMOS transistor. In some embodiments, the switch transistor 120 may include a GaN HEMT, a SiC JFET, a SiC MOSFET, or a Silicon MOSFET, which is not limited in the disclosure.

The detection circuit 130 may be electrically connected between the endpoint S and the endpoint CS to detect a current signal flowing through the switch transistor 120. The power management circuit 140 may be electrically connected to the endpoint VGX and the endpoint VCC to obtain power and energy required for operating the operation circuit 12. The logic circuit 160 may be electrically connected to the endpoint IN to receive an input signal, causing the operation circuit 12 to perform a corresponding operation. The gate driver 150 is electrically connected between the logic circuit 160 and the switch transistor 120 to drive or control the switch transistor 120. The protection circuit 170 is electrically connected to the logic circuit, and may provide electrical protection and temperature is protection for the switch transistor 120. The protection circuit 170 may provide electrical protection and temperature protection for the switch transistor 120 according to the current signal detected by the detection circuit 130, so as to prevent the switch transistor 120 from being damaged by an excessive voltage, current, or temperature.

Figure 1D:
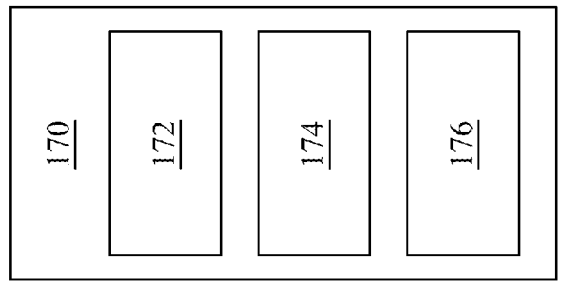
FIG. 1D is a block diagram of a protection circuit according to some embodiments of the disclosure.

FIG. 1D is a block diagram of a protection circuit 170 according to some embodiments of the disclosure.

The protection circuit 170 may include but is not limited to an overcurrent protection circuit 172, an overtemperature protection circuit 174, and an overvoltage protection circuit 176. In some embodiments, the overcurrent protection circuit 172 may receive or detect the current signal flowing through the switch transistor 120, as shown in FIG. 1C. The overcurrent protection circuit 172 may generate an output signal to the gate driver 150 shown in FIG. 1C to turn off the switch transistor 120 when detecting that the above signal exceeds a threshold. In some embodiments, the overtemperature protection circuit 174 may detect a temperature of the switch transistor 120. The overtemperature protection circuit 174 may generate an output signal to the gate driver 150 to turn off the switch transistor 120 when detecting that the above temperature exceeds a threshold. In some embodiments, the overvoltage protection circuit 176 may receive or detect a voltage signal applied to the switch transistor 120. The overvoltage protection circuit 176 may generate an output signal to the gate driver 150 to turn off the switch transistor 120 when detecting that the above signal exceeds a threshold.

Figure 2:
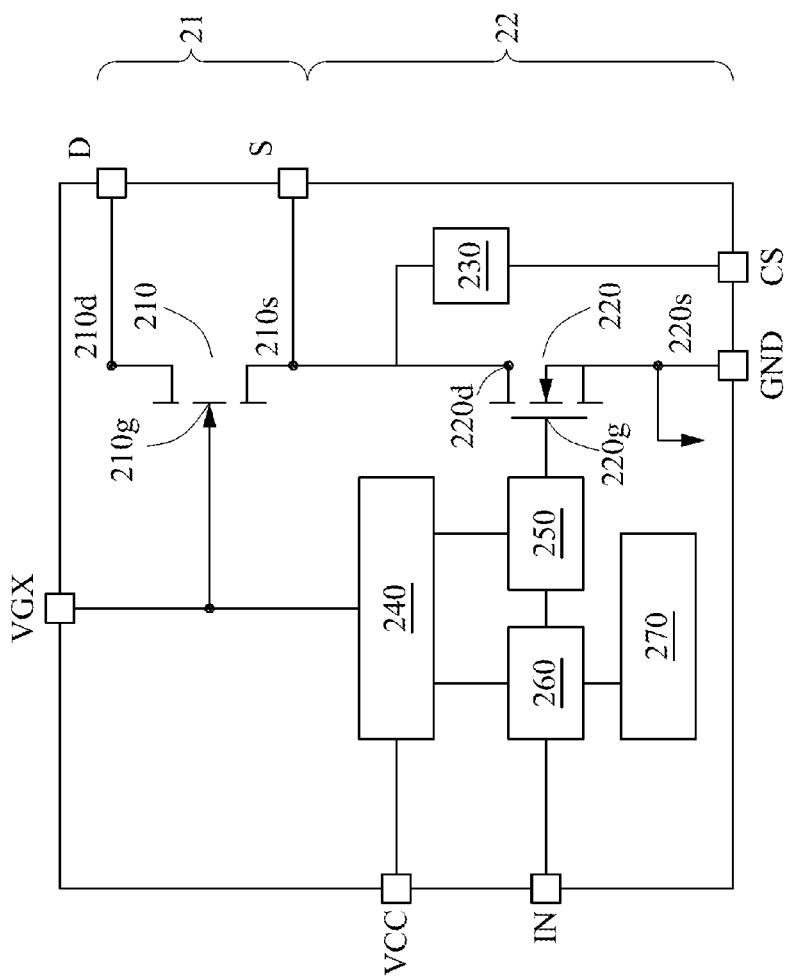
FIG. 2 is a block diagram of a circuit system according to some in embodiments of the disclosure.

FIG. 2 is a block diagram of a circuit system 20 according to some embodiments of the disclosure.

The circuit system 20 may include but is not limited to a power circuit 21 and an operation circuit 22. The operation circuit 22 may be electrically connected to the power circuit 21. In some embodiments, the operation circuit 22 may be configured to operate, detect, and protect the power circuit 21. As shown in FIG. 2, the power circuit 21 may include but is not limited to a switch transistor 210. The switch transistor 210 may include but is not is limited to a transistor. The operation circuit 22 may include but is not limited to a switch transistor 220, a detection circuit 230, a power management circuit 240, a gate driver 250, a logic circuit 260, and a protection circuit 270.

In some embodiments, the switch transistor 210 and the switch transistor 220 each may include but are not limited to a substrate, a buffer layer, a first nitride semiconductor layer, and a second nitride semiconductor layer. The substrate may include but is not limited to silicon (Si), doped Si, silicon carbide (SiC), germanium silicide (SiGe), gallium arsenide (GaAs), or other semiconductor materials. The substrate may include but is not limited to sapphire, silicon on insulator (SOI), or other suitable materials. The thickness of the substrate may be between about 200 μm to about 400 μm, for example, 220 μm, 240 μm, 260 μm, 280 μm, 300 μm, 320 μm, 340 μm, 360 μm, or 380 μm. A buffer layer may be arranged on the substrate. The buffer layer may be configured to reduce defects caused by lattice mismatch between the substrate and the nitride semiconductor layer.

The first nitride semiconductor layer (or a channel layer) may be arranged on the substrate. The first nitride semiconductor layer (or the channel layer) may be arranged on the buffer layer. The first nitride semiconductor layer may include a III-V group layer. The first nitride semiconductor layer may include but is not limited to group III nitride, such as the compound $In_aAl_bGa_{1-a-b}N$, where a+b≤1. The group III nitride further includes but is not limited to, for example, the compound $Al_aGa_{(1-a)}N$, where a≤1. The first nitride semiconductor layer may include a gallium nitride (GaN) layer. GaN has a band gap of about 3.4 eV. The thickness of the first nitride semiconductor layer may be but is not limited to about 0.1 μm to about 1 μm.

The second nitride semiconductor layer (or a barrier layer) may be arranged on the first nitride semiconductor layer. The second nitride semiconductor layer may include a III-V group layer. The second nitride semiconductor layer may include but is not limited to group III nitride, such as the compound $In_aAl_bGa_{1-a-b}N$, where a+b≤1. The group III nitride may further include but is not limited to, for example, the compound $Al_aGa_{(1-a)}N$, where a≤1. A band gap of the second nitride semiconductor layer may be larger than a band gap of the first nitride semiconductor layer. The second nitride semiconductor layer may include an aluminum gallium nitride (AlGaN) layer. AlGaN has a band gap of about 4.0 eV. The thickness of the second nitride semiconductor layer may be but is not limited to about 10 nm to about 100 nm. A heterojunction is formed between the second nitride semiconductor layer and the first nitride semiconductor layer, and polarization of the heterojunction forms a two-dimensional electron gas (2DEG) region in the first nitride semiconductor layer.

As shown in FIG. 2, in the disclosure, a gate 210g of the switch transistor 210 is electrically connected to the endpoint VGX, a drain 210d of the switch transistor 210 is electrically connected to the endpoint D, and a source 210s of the switch transistor 210 is electrically connected to the endpoint S. The switch transistor 220 is connected in series with the switch transistor 210 to operate, detect, and protect the switch transistor 210. The drain 220d of the switch transistor 220 is electrically connected to the source 210s of the switch transistor 210, the endpoint S, and the detection circuit 230. A gate 220g of the switch transistor 220 is electrically connected to a gate driver 250. A source 220s of the switch transistor 220 is electrically connected to the endpoint GND.

Figure 3:
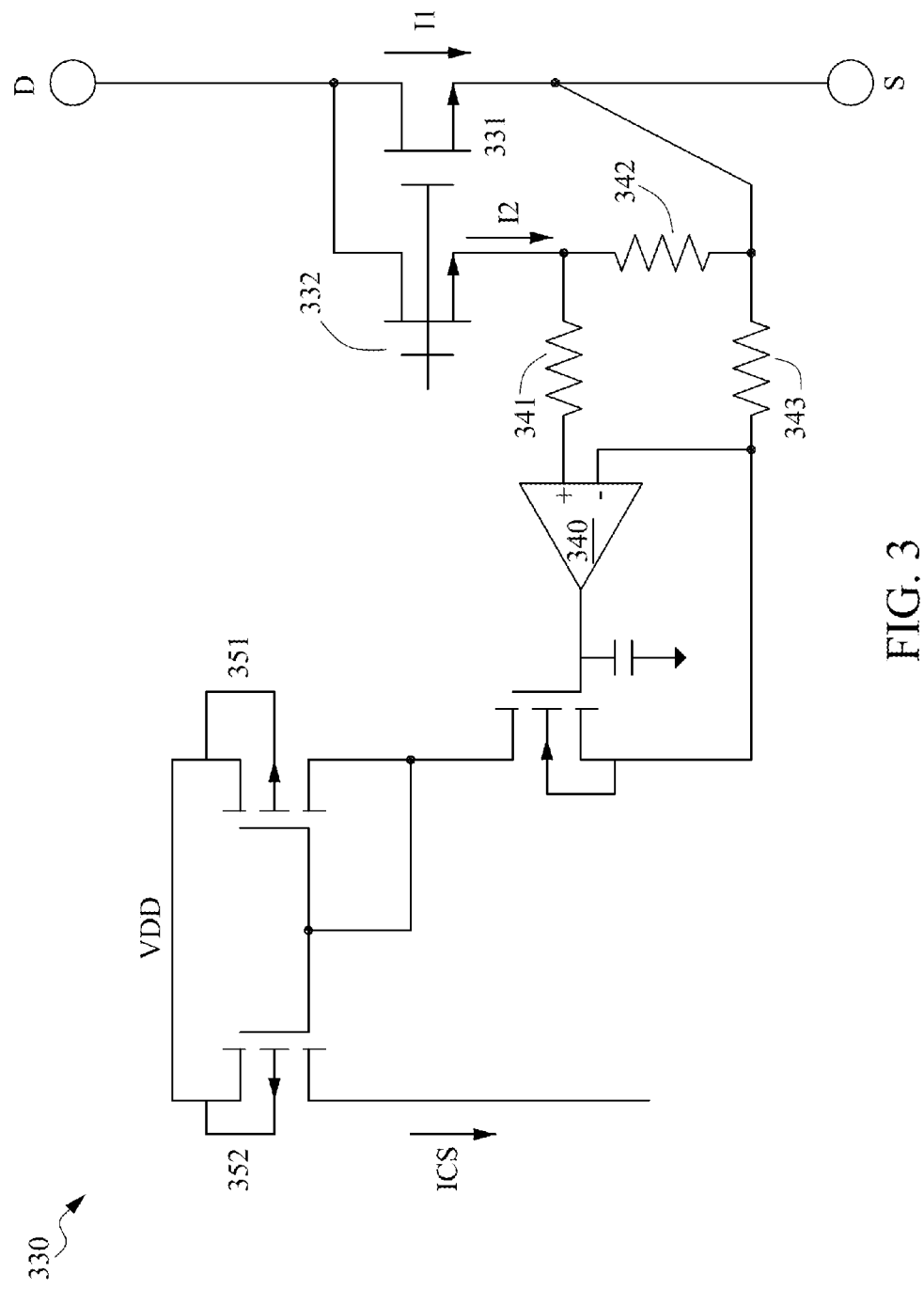
FIG. 3 is a topology diagram of a detection circuit according to some embodiments of the disclosure.

FIG. 3 is a topology diagram of a detection circuit 330 according to some embodiments of the disclosure. The detection circuit 330 in FIG. 3 may correspond to the detection circuit 230 in FIG. 2. A switch transistor 331 in FIG. 3 may correspond to the switch transistor 210 in FIG. 2. The detection circuit 330 may include a current mirror circuit. The detection circuit 330 may include but is not limited to switch transistors 331 and 332, an amplifier 340, resistors 341, 342, and 343, and switch transistors 351 and 352. The detection circuit 330 may be configured to generate another current signal ICS in proportion to a current signal I1.

In some embodiments, a current signal I2 flowing through the switch transistor 332 has a proportional relationship with the current signal I1 flowing through the switch transistor 331. For example, a size ratio of the current signal I2 flowing through the switch transistor 332 to the current signal I1 flowing through the switch transistor 331 is 1:K, where K is a positive integer greater than 1 In some embodiments, the current signal I2 flowing through the switch transistor 332 is converted into an equally proportional voltage signal by the amplifier 340. The voltage signal may control the mirror current source VDD, and the mirror current source VDD may be a circuit module with a proportional relationship of M:1. In some embodiments, the mirror current source VDD may generate a current signal ICS in proportion to the detected current signal I1.

Figure 4:
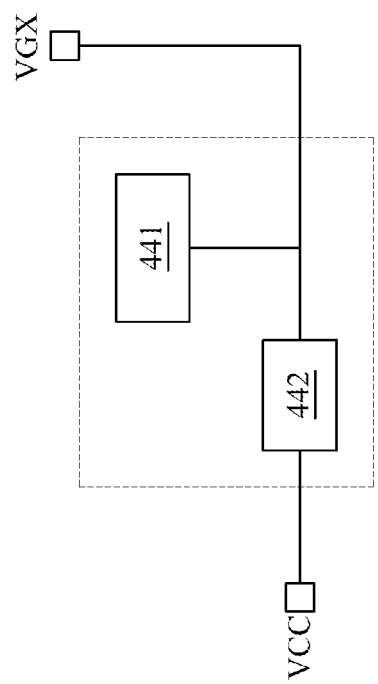
FIG. 4 is a block diagram of a power management circuit according to some embodiments of the disclosure.

FIG. 4 is a block diagram of a power management circuit 440 according to some embodiments of the disclosure. The power management circuit 440 in FIG. 4 may correspond to the power management circuit 240 in FIG. 2. The power management circuit 440 may include but is not limited to a low-dropout regulator (LDO) 442 and an undervoltage-lockout (UVLO) regulator 441. The power management circuit 440 may include but is not limited to an endpoint VCC and an endpoint VGX. The low dropout voltage regulator 442 may be electrically connected between the UVLO regulator 441 and the endpoint VCC. The UVLO regulator 441 may be electrically connected between the LDO 442 and the endpoint VGX.

Figure 5:
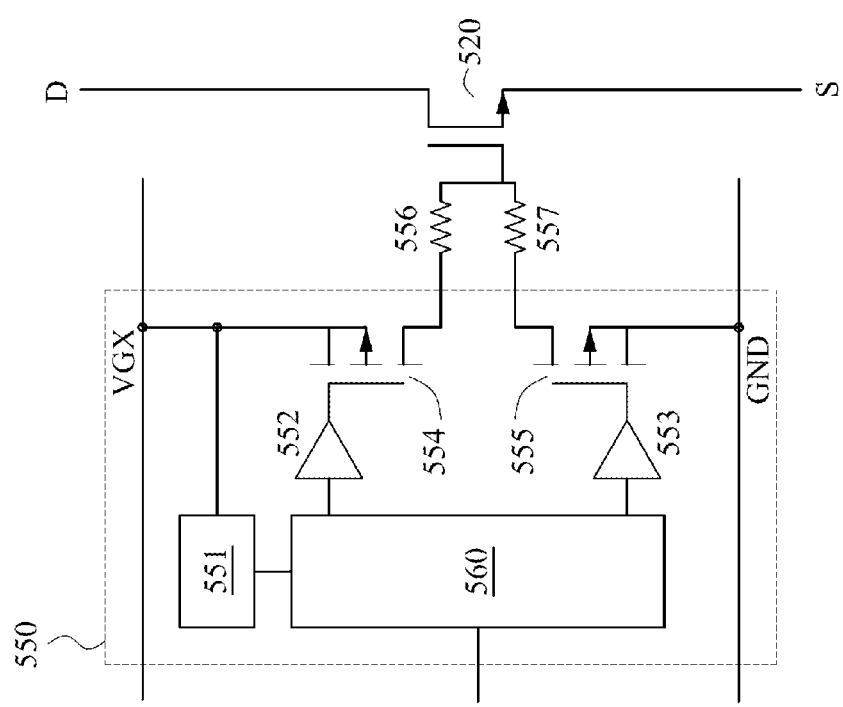
FIG. 5 is a topology diagram of a gate driver according to some embodiments of the disclosure.

FIG. 5 is a topology diagram of a gate driver 550 according to some embodiments of the disclosure. The gate driver 550 in FIG. 5 may correspond to the gate driver 250 in FIG. 2. A switch transistor 520 in FIG. 5 may correspond to the switch transistor 220 in FIG. 2. A logic circuit 560 in FIG. 5 may correspond to the logic circuit 260 in FIG. 2. The gate driver 550 may include but is not limited to a UVLO regulator 551, amplifiers 552 and 553, switch transistors 554 and 555, and the logic circuit 560.

In some embodiments, a gate of the switch transistor 554 is electrically connected to an output of the amplifier 552. A drain of the switch transistor 554 is electrically connected to the endpoint VGX and the UVLO regulator 551. A source of the switch transistor 554 is electrically connected to another switch transistor 520 through a resistor 556. In some embodiments, a gate of the switch transistor 555 is electrically connected to an output of the amplifier 553. A source of the switch transistor 555 is electrically connected to the endpoint GND. A drain of the switch transistor 555 is electrically connected to the switch transistor 520 through a resistor 557.

Figure 6:
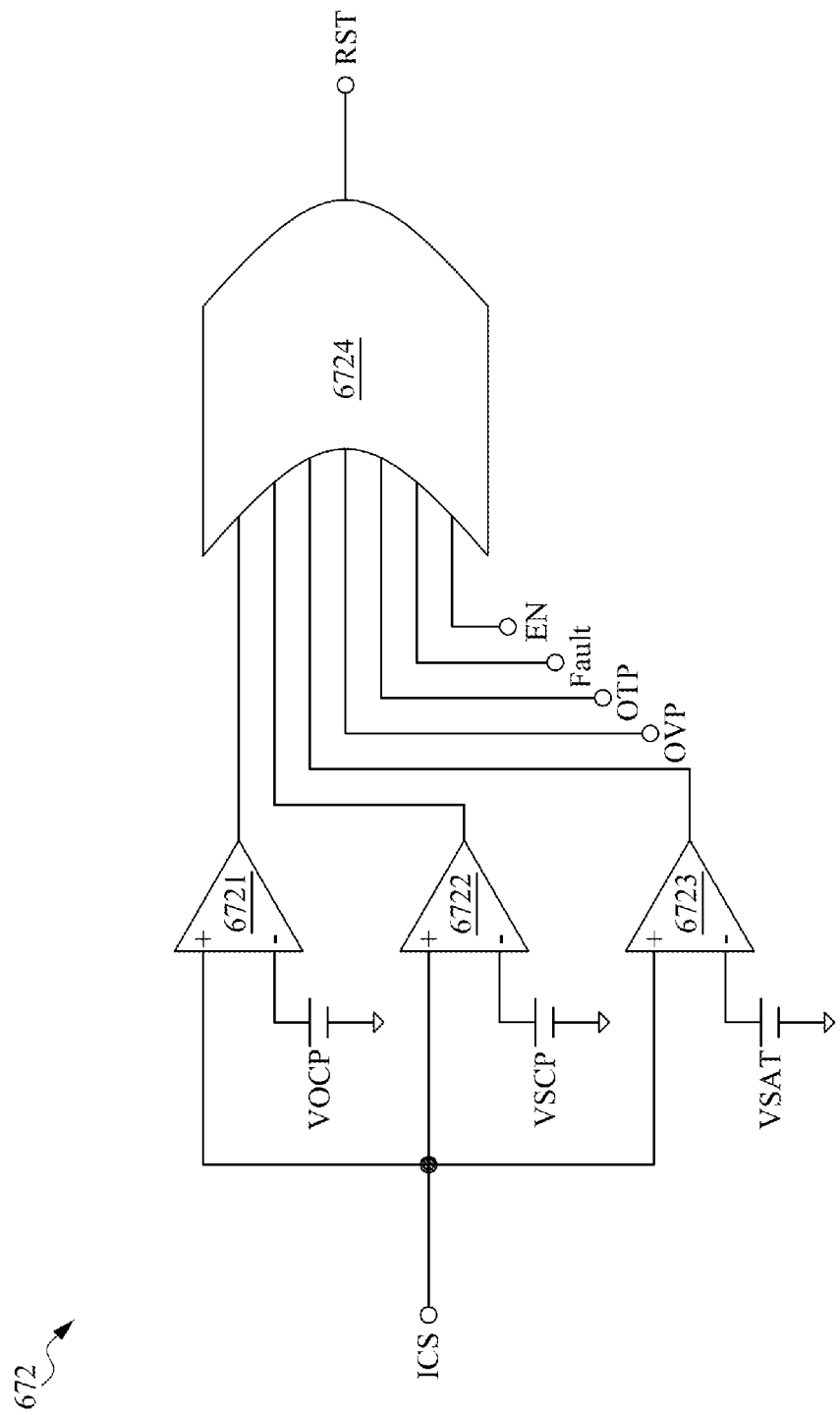
FIG. 6 is a topology diagram of an overcurrent protection circuit according to some embodiments of the disclosure.

FIG. 6 is a topology diagram of an overcurrent protection circuit 672 according to some embodiments of the disclosure. The overcurrent protection circuit 672 in FIG. 6 may correspond to the overcurrent protection circuit 172 in FIG. 1D. The overcurrent protection circuit 672 may generate another signal RST to the gate driver 250 shown in FIG. 2 according to the current signal ICS to turn off the switch transistor 220.

As shown in FIG. 6, the overcurrent protection circuit 672 may include but is not limited to a logic gate 6724 and comparators 6721, 6722, and 6723. A non-inverting input terminal of the comparator 6721 receives the current signal ICS, an inverting input terminal of the comparator 6721 is electrically connected to a voltage source VOCP, and an output of the comparator 6721 is electrically connected to the logic gate 6724. A non-inverting input terminal of the comparator 6722 receives the current signal ICS, an inverting input terminal of the comparator 6722 is electrically connected to a voltage source VSCP, and an output of the comparator 6722 is electrically connected to the logic gate 6724. A non-inverting input terminal of the comparator 6723 receives the current signal ICS, an inverting input terminal of the comparator 6723 is electrically connected to a voltage source VSAT, and an output of the comparator 6723 is electrically connected to the logic gate 6724.

In some embodiments, the logic gate 6724 may be configured to generate a signal RST according to the outputs of the comparators 6721, 6722, and 6723. The logic gate 6724 is electrically connected to an endpoint OVP, an endpoint OTP, an endpoint Fault, an endpoint EN, and the outputs of comparators 6721, 6722, and 6723. The overcurrent protection circuit 672 may generate a signal RST to the gate driver to turn off the switch transistor when detecting that the current signal ICS signal exceeds a threshold. The above threshold may be associated with but is not limited to the voltage source VOCP. The above threshold may be associated with but is not limited to the voltage source VSCP. The above threshold may be associated with but is not limited to the voltage source VSAT. The above threshold may be associated with but is not limited to the voltage source VOCP. The above threshold may be associated with but is not limited to the endpoint OTP. The above threshold may be associated with but is not limited to the endpoint OVP. The above threshold may be associated with but is not limited to the endpoint Fault. The above threshold may be associated with but is not limited to the endpoint EN.

Figure 7:
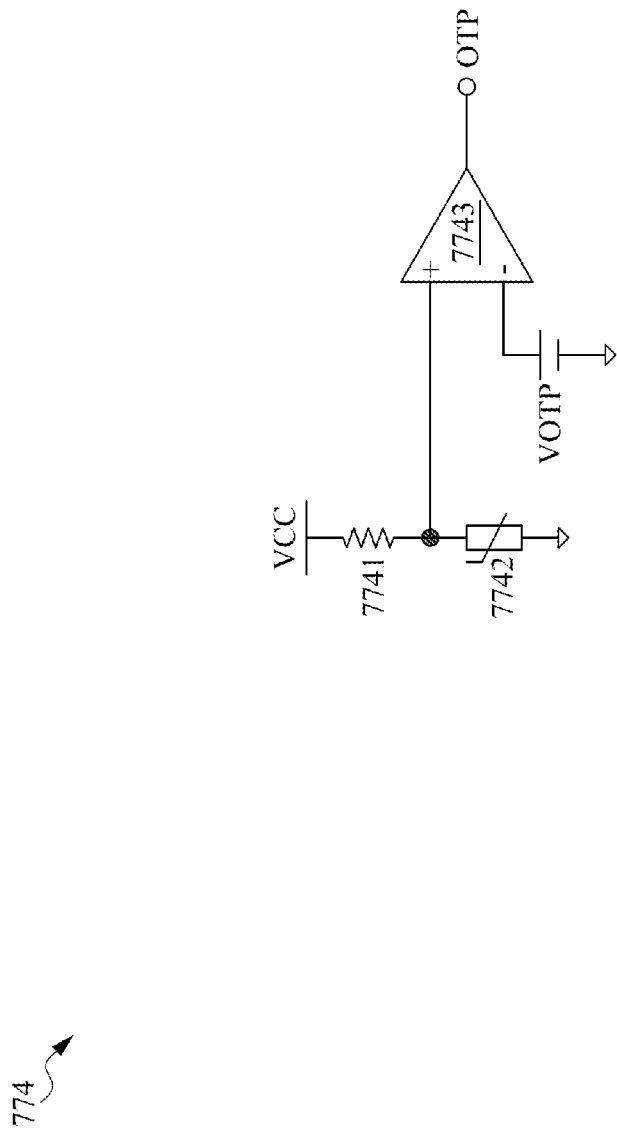
FIG. 7 is a topology diagram of an overtemperature protection circuit according to some embodiments of the disclosure.

FIG. 7 is a topology diagram of an overtemperature protection circuit 774 according to some embodiments of the disclosure. The overtemperature protection circuit 774 in FIG. 7 may correspond to the overtemperature protection circuit 174 in FIG. 1D. The overtemperature protection circuit 774 may generate a signal to the gate driver 250 to turn off the switch transistor 220 according to the temperature of the switch transistor 220 shown in FIG. 2. The overtemperature protection circuit 774 may turn off the switch transistor 220 when the temperature of the switch transistor 220 is too high, to realize the protection function.

As shown in FIG. 7, the overtemperature protection circuit 774 may include but is not limited to a resistor 7741, a resistor 7742, and a comparator 7743. The resistor 7741 may be electrically connected between a voltage source VCC and a non-inverting input terminal of the comparator 7743. The resistor 7742 may be electrically connected between a ground terminal and a non-inverting input terminal of the comparator 7743. An inverting input terminal of the comparator 7743 is electrically connected to a voltage source VOTP. An output terminal of the comparator 7743 is electrically connected to the endpoint OTP.

In some embodiments, the resistor 7742 includes a thermistor with a negative temperature coefficient. An impedance of the thermistor with the negative temperature coefficient is inversely proportional to a temperature. When the temperature increases, the impedance of the thermistor with the negative temperature coefficient decreases. When the temperature decreases, the impedance of the thermistor with the negative temperature coefficient increases. In some embodiments, when detecting that the temperature of the switch transistor exceeds a threshold, the overtemperature protection circuit 774 may generate a signal to the gate driver through the endpoint OTP to turn off the switch transistor. The above threshold may be associated with but not limited to the negative temperature coefficient of the thermistor. The above threshold may be associated with but is not limited to the voltage source VOTP.

Figure 8:
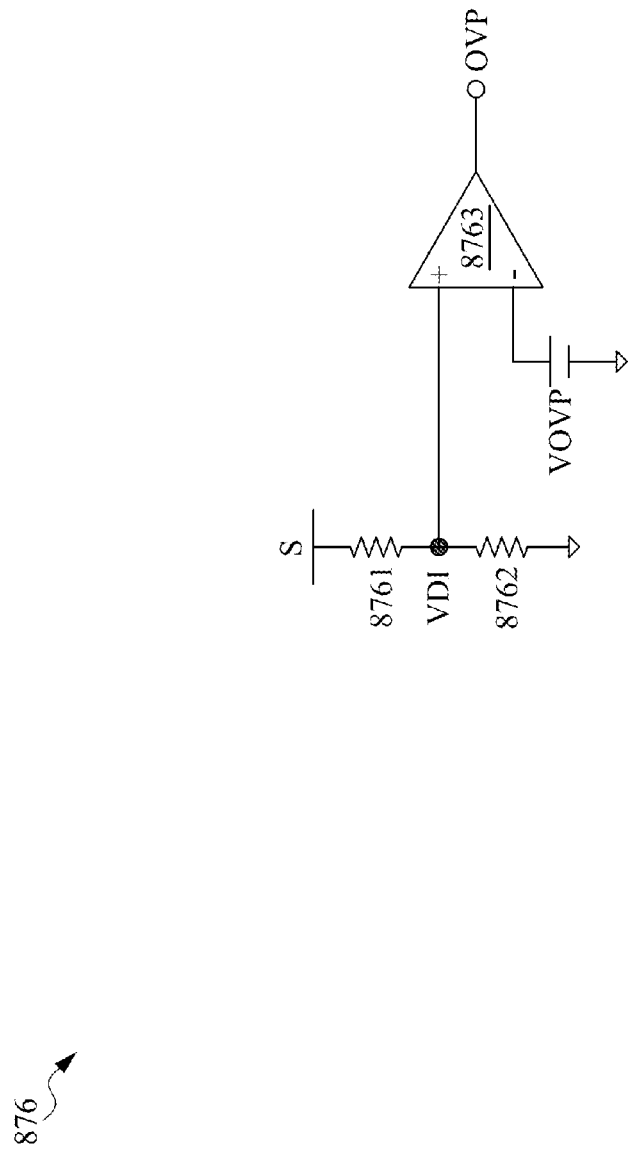
FIG. 8 is a topology diagram of an overvoltage protection circuit according to some embodiments of the disclosure.

FIG. 8 is a topology diagram of an overvoltage protection circuit 876 according to some embodiments of the disclosure. The overvoltage protection circuit 876 in FIG. 8 may correspond to the overvoltage protection circuit 176 in FIG. 1D. The overvoltage protection circuit 876 may generate a signal to the gate driver 250 to turn off the switch transistor 220 according to the voltage of the switch transistor 220 shown in FIG. 2. The overvoltage protection circuit 876 may turn off the switch transistor 220 when the voltage of the switch transistor 220 is too high, to realize the protection function.

As shown in FIG. 8, the overvoltage protection circuit 876 may include but is not limited to a resistor 8671, a resistor 8762, and a comparator 8763. The resistor 8761 may be electrically connected between the endpoint S and a non-inverting input terminal of the comparator 8763. The resistor 8761 may be electrically connected between the endpoint S and an endpoint VDI. The resistor 8762 may be electrically connected between a ground terminal and a non-inverting input terminal of the comparator 8763. The resistor 8762 may be electrically connected between the ground terminal and the endpoint VDI. An inverting input terminal of the comparator 8763 is electrically connected to a voltage source VOTP. An output terminal of the comparator 8763 is electrically connected to the endpoint OVP.

In some embodiments, the overvoltage protection circuit 876 may detect a partial voltage on the endpoint VDI. The non-inverting input terminal of the comparator 8763 is configured to receive the above partial voltage and turn off the switch transistor when the voltage of the switch transistor is too high. In some embodiments, when detecting that the voltage of the switch transistor exceeds a threshold, the overvoltage protection circuit 876 may generate a signal to the gate driver through the endpoint OVP to turn off the switch transistor. The above threshold may be associated with but is not limited to an impedance of the resistor 8761. The above threshold may be associated with but is not limited to an impedance of the resistor 8762.

Figure 9A:
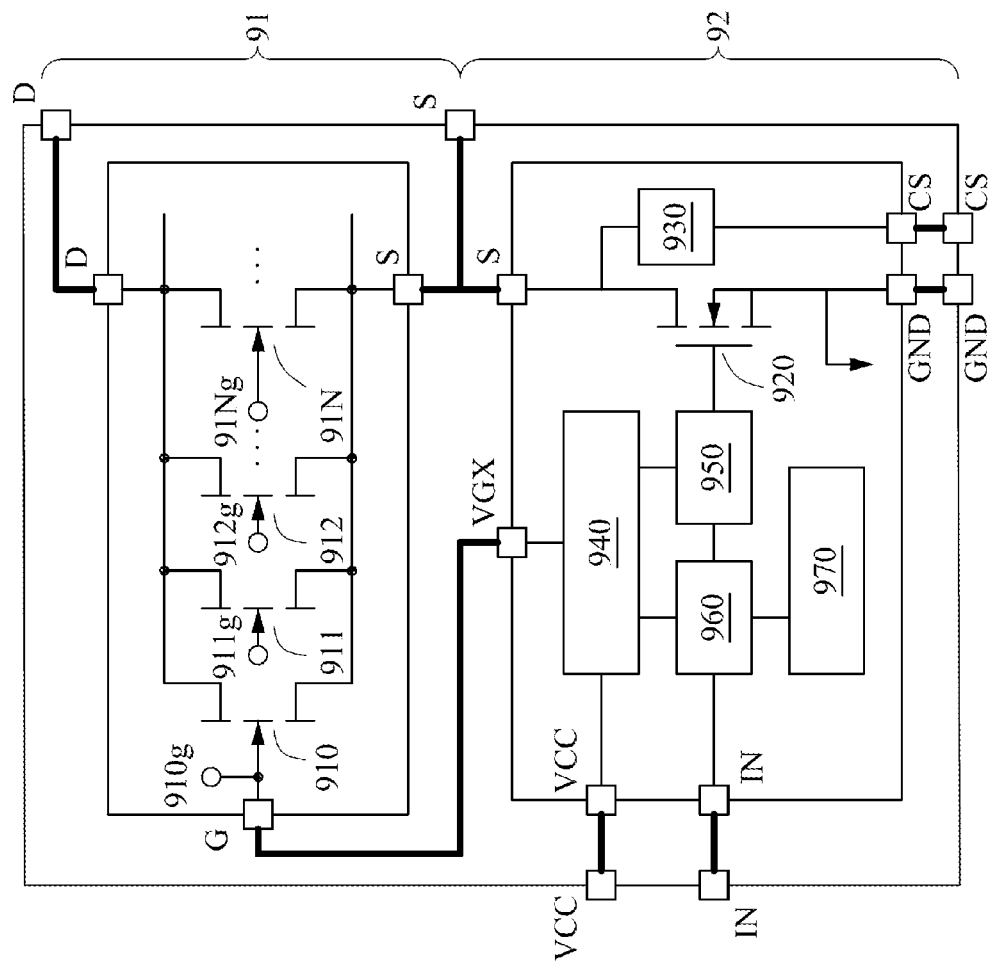
FIG. 9A is a block diagram of a circuit system according to some embodiments of the disclosure.

FIG. 9A is a block diagram of a circuit system 90A according to some embodiments of the disclosure. The circuit system 90A may include a power circuit 91 and an operation circuit 92. As shown in FIG. 9A, the power circuit 91 and the operation circuit 92 may be packaged together. The power circuit 91 and the operation circuit 92 of the circuit system 90A may be packaged as a whole. In an embodiment, the power circuit 91 and the operation circuit 92 of the circuit system 90A may be packaged separately or individually according to use requirements, which is not limited in the disclosure.

The power circuit 91 may include a plurality of switch transistors 910 to 91N. The plurality of switch transistors 910 to 91N may be connected in parallel. Each of the plurality of switch transistors 910 to 91N may include a GaN transistor. The operation circuit 92 may control the plurality of switch transistors 910 to 91N of the power circuit 91. The operation circuit 92 may include a switch transistor 920, a detection circuit 930, a power management circuit 940, a gate driver 950, a logic circuit 960, and a protection circuit 970. In an embodiment, an operating voltage of the switch transistor 920 of the operation circuit 92 may be greater than an operating voltage of the switch transistors 910 to 91N of the power circuit 91. In an embodiment, the operating voltage of the switch transistor 920 of the operation circuit 92 may be greater than the operating voltage of the switch transistors 910 to 91N of the power circuit 91. The operation circuit 92 may correspond to or be similar to the operation circuit 20 in FIG. 2, and therefore is not described in detail herein.

Figure 9B:
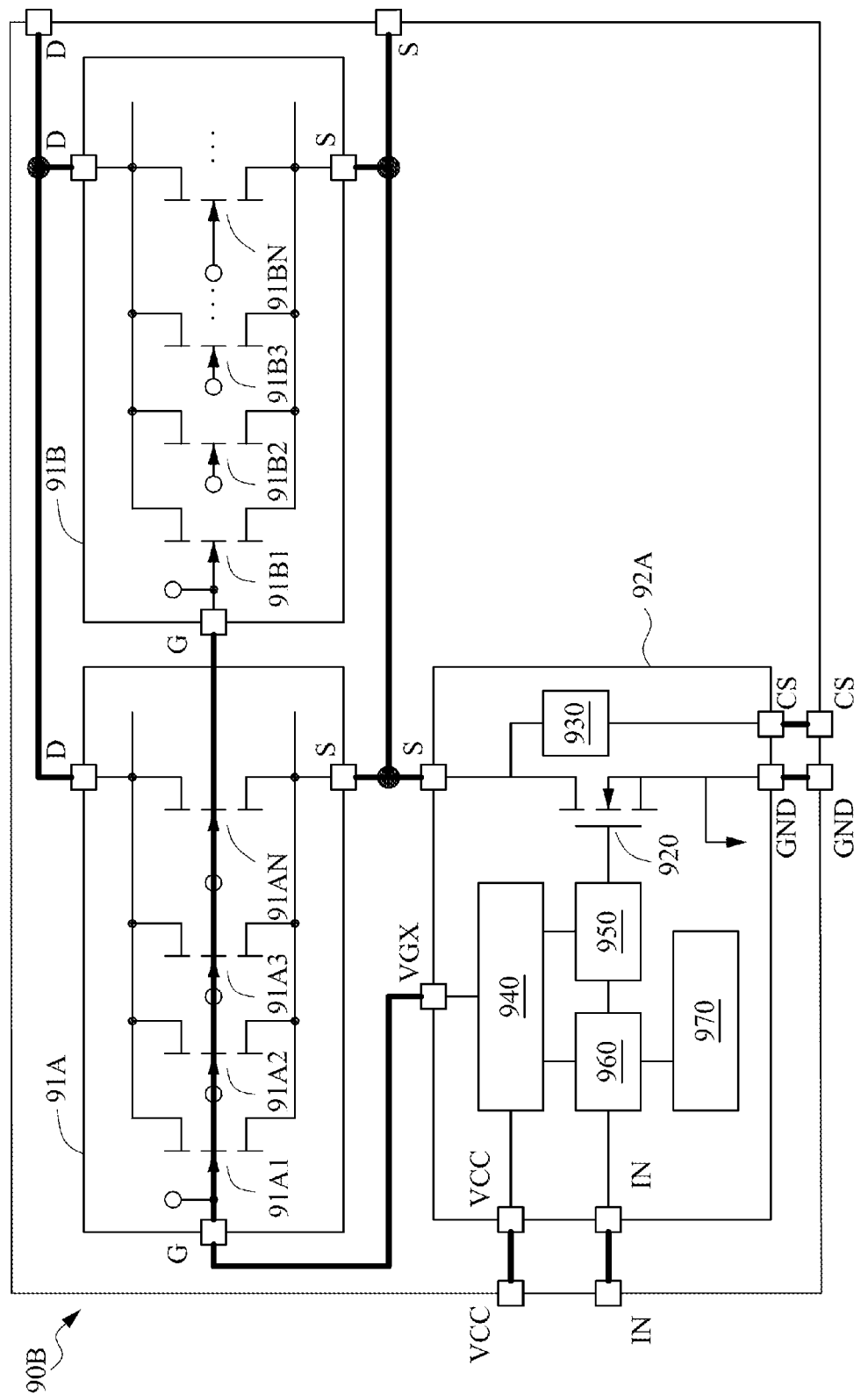
FIG. 9B is a block diagram of a circuit system according to some other embodiments of the disclosure.

FIG. 9B is a block diagram of a circuit system 90B according to some other embodiments of the disclosure. The circuit system 90B may include a power circuit 91A, a power circuit 91B, and an operation circuit 92A. As shown in FIG. 9B, the two power circuits 91A and 91B may be packaged together. In an embodiment, the two power circuits 91A and 91B and the operation circuit 92A may be packaged together. The two power circuits 91A and 91B and the operation circuit 92A may be packaged as a whole. In an embodiment, the two power circuits 91A and 91B and the operation circuit 92A of the circuit system 90A may be packaged separately or individually according to use requirements, which is not limited in the disclosure.

In an implementation, the power circuit 91A may include a plurality of switch transistors 91A1 to 91AN. The plurality of switch transistors 91A1 to 91AN may be connected in parallel. Each of the plurality of switch transistors 91A1 to 91AN may include a GaN transistor. The operation circuit 92A may control the plurality of switch transistors 91A1 to 91AN of the power circuit 91A. In an implementation, the power circuit 91B may include a plurality of switch transistors 91B 1 to 91BN. The plurality of switch transistors 91B1 to 91BN may be connected in parallel. Each of the plurality of switch transistors 91B1 to 91BN may include a GaN transistor.

The operation circuit 92A may control the plurality of switch transistors 91B1 to 91BN of the power circuit 91B. The operation circuit 92A may simultaneously control and detect the two power circuits 91A and 91B. As shown in FIG. 9B, drains of the switch transistors 91A1 to 91AN may be electrically connected to drains of the switch transistors 91B1 to 91BN. Gates of the switch transistors 91A1 to 91AN may be electrically connected to gates of the switch transistors 91B1 to 91BN. Sources of the switch transistors 91A1 to 91AN may be electrically connected to sources of the switch transistors 91B1 to 91BN. In an embodiment, an operating voltage of the switch transistor 920 of the operation circuit 92A may be greater than an operating voltage of the switch transistors 91A1 to 91AN and an operating voltage of the switch transistors 91B1 to 91BN. In an embodiment, the operating voltage of the switch transistor 920 of the operation circuit 92A may be greater than the operating voltage of the switch transistors 91A1 to 91AN and the operating voltage of the switch transistors 91B1 to 91BN.

According to the disclosure, one operation circuit can be used in combination with a plurality of power circuits in a modular manner, different product forms may be designed according to use requirements, and the power and current can be easily expanded. In addition, various detection circuits, driving circuits, logic control and protection circuits are highly integrated in the circuit system of the disclosure. Compared with one operation circuit and one power circuit being used and being connected in parallel, the circuit system in the disclosure operates, controls, and detects the plurality of high-voltage power circuits through a low-voltage operation circuit. Therefore, the disclosed circuit system can reduce the work errors by optimizing the chip processes or tightening the tests, which effectively avoids adverse effects caused by various effects such as parasitic parameters, delay differences, and electrical mismatches caused by adding both a high-voltage circuit assembly and a low-voltage circuit assembly.

Figure 10:
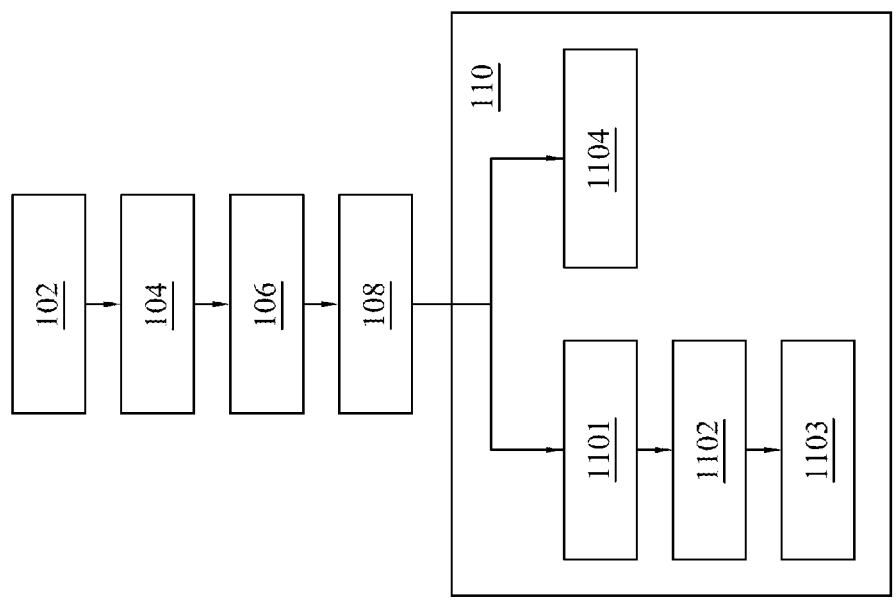
FIG. 10 shows steps of a method for manufacturing and operating a circuit system according to some embodiments of the disclosure.

FIG. 10 shows steps of a method for manufacturing and operating a circuit system according to some embodiments of the disclosure. In step 102, a power circuit for high-power operation may be formed. In step 104, an operation circuit may be formed, which is electrically connected to the power circuit. In an embodiment, the operation circuit may include at least one switch transistor. In step 106, the operation of the power circuit may be controlled by the operation circuit. In step 108, a first signal of the power circuit may be detected.

In an embodiment, step 110 may include a plurality of steps 1101, 1102, 1103, and 1104. In step 1101, a second signal in proportion to the first signal may be generated. In step 1102, the second signal may be received. In step 1103, a third signal is generated according to the second signal to turn off the switch transistor. In addition, in step 1104, the switch transistor may be turned off when a temperature or a voltage of the switch transistor is too high. It should be understood that the order shown for the above steps, actions, or events should not be interpreted as restrictive. For example, some steps may occur in a different order or simultaneously.

According to some embodiments of the disclosure, a circuit system includes a power circuit and an operation circuit. The operation circuit is electrically connected to the power circuit. The operation circuit is configured to control operation of the power circuit, detect a first signal of the power circuit during the operation, and protect the power circuit in response to the first signal.

According to some embodiments of the disclosure, a method for manufacturing and operating a circuit system includes: forming a power circuit, the power circuit being applicable to a high-power operation; forming an operation circuit, the operation circuit being electrically connected to the power circuit, and including a switch transistor, and the operation circuit being configured to control the operation of the power circuit; detecting a first signal of the power circuit; and protecting the power circuit.

According to some embodiments of the disclosure, a circuit system includes a first power circuit and an operation circuit. The first power circuit includes a plurality of first switch transistors. The plurality of first switch transistors are connected in parallel. The operation circuit is electrically connected to the first power circuit. The operation circuit is configured to control the plurality of first switch transistors.

An operating voltage of the operation circuit is less than an operating voltage of the plurality of first switch transistors.

Unless otherwise specified, spatial descriptions such as "on", "under", "up", "left", "right", "down", "top", "bottom", "vertical", "horizontal", "side", "higher than", "lower than", "upper", "above" and "below" are indicated relative to the orientation shown in the figures. It should be understood that the spatial description used herein is only for the purpose of illustration, and the actual implementation of the structure described herein can be arranged spatially in any orientation or manner, with the limitation that the advantages of the embodiments of the disclosure will not be biased by such arrangement.

The term "vertical" used herein is used for referring to upward and downward directions, while the term "horizontal" refers to a direction transverse to the vertical direction.

The terms "approximately", "substantially", "roughly", and "about" used herein are used for describing and explaining small changes. When used in combination with an event or a situation, the terms may mean instances where the event or the situation occurs precisely and where the event or the situation occurs very similarly. For example, when used in combination with a numerical value, the terms may mean a variation range less than or equal to ±10% of a value, for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05% of the value. For example, if a first value is within a variation range of less than or equal to ±10% of the second value, for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05% of the second value, the first value may be considered as being "substantially" the same as or equal to the second value. For example, "substantially" perpendicular may mean a range of angle change relative to 90° that is less than or equal to ±10°, for example, less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

If an offset between two surfaces does not exceed 5 µm, 2 µm, 1 µm, or 0.5 µm, the two surfaces may be considered as coplanar or substantially coplanar. If an offset between a highest point and a lowest point of a surface does not exceed 5 µm, 2 µm, 1 µm, or 0.5 µm, the surface may be considered as substantially flat.

Unless otherwise clearly specified in the context, the singular terms "one (a/an)" and "the" used herein may include a plurality of referents.

The terms "conductive", "electrically conductive", and "conductivity" used herein mean the ability to transmit a current. Conductive materials usually indicate those materials that present little or no resistance to current flow. A measure of conductivity is Siemens per meter (S/m). Generally, a conductive material is a material with a conductivity greater than about 104 S/m (such as at least 105 S/m or at least 106 S/m). The conductivity of materials may sometimes vary with a temperature. Unless otherwise specified, the conductivity of materials is measured at a room temperature.

In addition, quantities, ratios, and other numerical values are sometimes presented in a range format herein. It should be understood that such range format is used for convenience and conciseness, and should be flexibly understood, and includes not only the numerical values explicitly designated as range limits, but also all individual numerical values or sub ranges covered in that range, as if each numerical value and sub-range were explicitly specified.

Although the disclosure has been described and illustrated with reference to specific embodiments thereof, these descriptions and illustrations do are not limitative. It should be understood by a person skilled in the art that various changes may be made and equivalents may be substituted without departing from the true spirit and scope of the disclosure as defined by the appended claims. The drawings may not be necessarily drawn to scale. There may be variables between the process reproduction in the disclosure and the actual device due to manufacturing processes and tolerances. There may be other embodiments of the disclosure which are not specifically illustrated. The specification and drawings are to be regarded as illustrative rather than limitative. Modifications may be made to make a particular situation, material, composition of matter, method, or technology in be applicable to the objective, spirit and scope of the disclosure. All such modifications are within the scope of the appended claims. Although the methods disclosed herein have been described with reference to the specific operations that are performed in a specific order, it should be understood that these operations can be combined, subdivided, or reordered to form an equivalent method without departing from the teachings of the disclosure. Correspondingly, unless otherwise specifically indicated herein, the order and grouping of operations are not limitation on the disclosure.

What is claimed is:

1. A circuit system, comprising:
   a power circuit comprising a first switch transistor; and
   an operation circuit, electrically connected to the power circuit and configured to control operation of the power circuit, detect a first signal of the power circuit during the operation, and protect the power circuit in response to the first signal;
   wherein the operation circuit comprises:
   a second switch transistor;
   a gate driver, configured to drive the second switch transistor;
   a detection circuit, configured to detect the first signal flowing through the first switch transistor, wherein the detection circuit comprises a current mirror circuit configured to generate a second signal in proportion to the first signal; and
   an overcurrent protection circuit, configured to receive the second signal and generate a third signal to the gate driver according to the second signal to turn off the second switch transistor;
   wherein the overcurrent protection circuit comprises:
   a plurality of comparators, each non-inverting input terminal of the plurality of comparators is configured to receive the second signal; and
   a logic gate, configured to generate a third signal according to outputs of the plurality of comparators.

2. The circuit system according to claim 1, wherein the first switch transistor comprising:
   a substrate;
   a first nitride semiconductor layer, arranged on the substrate; and
   a second nitride semiconductor layer, arranged on the first nitride semiconductor layer, a band gap of the second nitride semiconductor layer being larger than a band gap of the first nitride semiconductor layer.

3. The circuit system according to claim 1, wherein the gate driver is electrically connected to a gate of the second switch transistor, and a drain of the second switch transistor is electrically connected to a source of the first switch transistor.

4. The circuit system according to claim 3, wherein the operation circuit comprises:
an overtemperature protection circuit, configured to turn off the second switch transistor when a temperature of the second switch transistor is too high.

5. The circuit system according to claim 4, wherein the overtemperature protection circuit comprises a thermistor defined with a negative temperature coefficient.

6. The circuit system according to claim 3, wherein the operation circuit comprises:
an overvoltage protection circuit, configured to turn off the second switch transistor when a voltage of the second switch transistor is too high.

7. The circuit system according to claim 6, wherein the overvoltage protection circuit comprises:
a first resistor;
a second resistor, connected in series with the first resistor and configured to detect a partial voltage; and
a voltage comparator, having a non-inverting input terminal configured to receive the partial voltage and turn off the second switch transistor when the voltage of the second switch transistor is too high.

8. The circuit system according to claim 1, wherein an operating voltage of the first switch transistor is greater than an operating voltage of the second switch transistor.

9. The circuit system according to claim 1, wherein the power circuit comprises a plurality of first switch transistors, drains of the plurality of first switch transistors being electrically connected to each other, and sources of the plurality of first switch transistors being electrically connected to each other.

10. The circuit system according to claim 1, wherein the power circuit and the operation circuit are packaged separately.

11. The circuit system according to claim 1, wherein the power circuit and the operation circuit are packaged together.

12. A circuit system, comprising:
a first power circuit, comprising a plurality of first switch transistors, the plurality of first switch transistors being connected in parallel; and
an operation circuit, electrically connected to the first power circuit and configured to control the plurality of first switch transistors, an operating voltage of the operation circuit being less than an operating voltage of the plurality of first switch transistors;
wherein the operation circuit comprises:
a third switch transistor;
a gate driver, configured to drive the third switch transistor;
a detection circuit, configured to detect a first signal flowing through the first switch transistor, wherein the detection circuit comprises a current mirror circuit configured to generate a second signal in proportion to the first signal; and
an overcurrent protection circuit, configured to receive the second signal and generate a third signal to the gate driver according to the second signal to turn off the third switch transistor;
wherein the overcurrent protection circuit comprises:
a plurality of comparators, each non-inverting input terminal of the plurality of comparators is configured to receive the second signal; and
a logic gate, configured to generate a third signal according to outputs of the plurality of comparators.

13. The circuit system according to claim 12, comprising:
a second power circuit, comprising a plurality of second switch transistors, the plurality of second switch transistors being connected in parallel, and the operation circuit being configured to control the plurality of second switch transistors.

14. The circuit system according to claim 13, wherein the first power circuit, the second power circuit, and the operation circuit are packaged separately.

15. The circuit system according to claim 12, wherein each of the plurality of first switch transistors comprises a GaN transistor.

* * * * *